Figure 1:
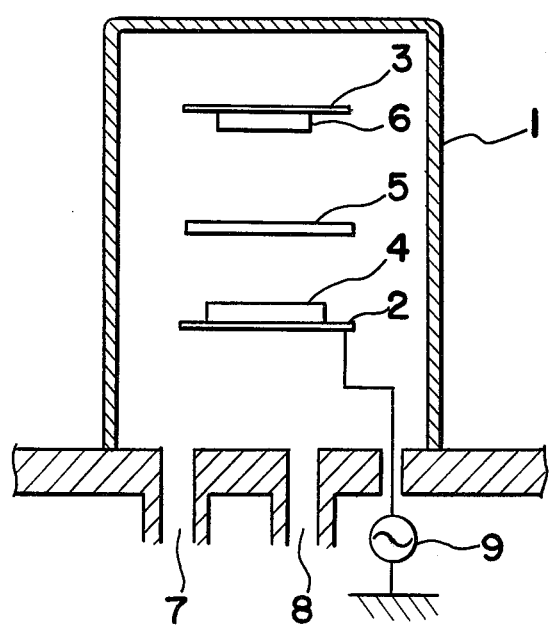

United States Patent [19]

Nishiyama et al.

[11] 4,174,421

[45] Nov. 13, 1979

[54] PIEZOELECTRIC CRYSTALLINE FILM OF ZINC OXIDE AND METHOD FOR MAKING SAME

[75] Inventors: Hiroshi Nishiyama, Mukou; Toshio Ogawa; Tasuku Mashio, both of Nagaokakyo, all of Japan

[73] Assignee: Murata Manufacturing Co., Ltd., Kyoto, Japan

[21] Appl. No.: 940,336

[22] Filed: Sep. 7, 1978

[30] Foreign Application Priority Data

Sep. 13, 1977 [JP] Japan .................................. 52-110894
Sep. 17, 1977 [JP] Japan .................................. 52-111763

[51] Int. Cl.$^2$ ...................... C23C 15/00; C04B 35/00
[52] U.S. Cl. .................................... 428/432; 428/469; 428/492; 428/539; 427/100; 252/62.9; 204/192 SP
[58] Field of Search ............... 252/62.9; 204/192 SP; 427/100; 428/426, 432, 457, 469, 492, 539

[56] References Cited

U.S. PATENT DOCUMENTS

| 3,420,763 | 1/1969 | Polito et al. ................ 204/192 SP |
| 3,573,960 | 4/1971 | Duncan ..................... 204/192 SP X |
| 3,766,041 | 10/1973 | Wasa et al. ................. 204/192 SP |
| 3,988,232 | 10/1976 | Wasa et al. ................. 204/192 SP |

*Primary Examiner*—Jack Cooper
*Attorney, Agent, or Firm*—Birch, Stewart, Kolasch and Birch

[57] ABSTRACT

Piezoelectric crystalline film of zinc oxide with a hexagonal crystal structure and a c-axis substantially perpendicular to the film surface, the crystalline film containing, as additive elements, vanadium and manganese together with or without copper. The piezoelectric crystalline films have high resistivity and a smooth surface, and make it possible to produce piezoelectric transducers with good conversion efficiency which can be used in a wide range of low to high frequencies. Such films can be made by a method comprising sputtering source materials, i.e., zinc oxide, vanadium and manganese together with or without copper onto a surface of a substrate to form a crystalline zinc oxide film, the sputtering being effected by using a film material source consisting essentially of a ceramic of zinc oxide containing vanadium, and manganese together with or without copper.

6 Claims, 1 Drawing Figure

PIEZOELECTRIC CRYSTALLINE FILM OF ZINC OXIDE AND METHOD FOR MAKING SAME

BACKGROUND AND SUMMARY OF THE INVENTION

This invention relates to piezoelectric crystalline films comprising zinc oxide having a hexagonal crystal structure, and a method for making the same.

In recent years, crystalline thin films of zinc oxide which show piezoelectricity have become of major interest as a piezoelectric material for various transducers. Such piezoelectric crystalline films of zinc oxide may be produced by various methods such as, for example, vacuum deposition methods, epitaxial growth methods, sputtering methods and ion plating methods. Among these methods, the sputtering methods, particularly, a radio-frequency sputtering method has been used very often lately because it has the advantage that the high growth rate of the oriented crystalline film is possible, thus making it possible to mass-produce piezoelectric crystalline films, industrially.

When making a piezoelectric crystalline film of zinc oxide on a substrate surface by the radio-frequency sputtering method, a ceramic of highly pure zinc oxide has been conventionally used as a film material source. However, even when radio-frequency sputtering is effected with such a source, it results in the formation of piezoelectric crystalline film which are poor in the adhesion to the substrate and low in the quality. In addition, it is difficult with such a film material source to make a piezoelectric crystalline film with a c-axis perpendicular to the substrate or film surface. If a piezoelectric crystalline film of zinc oxide has poor adhesion, various disadvantages occur. For example, when manufacturing an acoustic surface wave filter with such a zinc oxide film, it is difficult to form interdigital transducers on the film surface because of the peeling off of the film. Furthermore, the produced acoustic surface wave filter tends to have disconnection of interdigital transducers, and causes a large propagation loss of acoustic surface waves. Also, if the c-axis of the zinc oxide film is inclined with respect to the axis perpendicular to the substrate surface, the electromechanical coupling factor is lowered, thus making it difficult to produce a piezoelectric crystalline film transducer with good conversion efficiency.

Further, piezoelectric crystalline films of highly pure zinc oxide can be used only at high frequencies, but can not be used at low frequencies since resistivity thereof is not sufficiently high. Thus, an applicable frequency range of such a piezoelectric crystalline film is narrow.

The above matters will be evident from the theory on dielectric relaxation angular frequency ($\omega_c$) which is given by the following equation:

$$\omega_c = \frac{\sigma}{\epsilon_o \epsilon_{ZnO}} = \frac{1}{\epsilon_o \epsilon_{ZnO} \rho_o} \text{ (rad/s)} \quad (1)$$

where
$\sigma$ = conductivity of crystalline film $[\Omega^{-1} m^{-1}]$
$\epsilon_o$ = permittivity of vacuum [F/m]
$\epsilon_{ZnO}$ = permittivity of crystalline film
$\rho_o$ = resistivity of crystalline film $[\Omega \cdot m]$ From the equation (1), it will be seen that the dielectric relaxation angular frequency $\omega_c$ is inversely proportional to the resistivity of the film.

In general, it is recognized that the piezoelectric crystalline film shows piezoelectricity at frequencies where the following relation exists between the dielectric relaxation angular frequency ($\omega_c$) and an angular frequency ($\omega$) at the used frequency: $\omega_c << \omega$. In other words, the piezoelectric crystalline film can be used as a piezoelectric only at frequencies where the angular frequency ($\omega$) is sufficiently higher than the dielectric relaxation angular frequency ($\omega_c$) (normally, $\omega > \omega_c \times 100$).

For example, the dielectric relaxation angular frequency for the piezoelectric crystalline film consisting of highly pure zinc oxide (purity: 99.99%) can be found by the equation (1).

$$\omega_c = \frac{1}{\epsilon_o \epsilon_{ZnO} \rho_o} = 1.33 \times 10^6 \text{ (rad/s)}$$

where
$\epsilon_o = 8.854 \times 10^{-12}$ (F/M)
$\epsilon_{ZnO} = 8.5$
$\rho_o = 10^6$ ($\Omega \cdot$cm)

Since an angular frequency ($\omega$) equals $2\pi f$, it is found that the dielectric relaxation frequency $f_c$ is $$f_c = \frac{\omega_c}{2\pi} = \frac{1.33 \times 10^6}{2 \times 3.14} = 2.12 \times 10^5 \text{ (Hz)}$$

Thus, the piezoelectric crystalline films of highly pure zinc oxide can be used at frequencies higher than 100 MHz. In other words, such piezoelectric crystalline films are applicable only at very high frequencies.

As an improved piezoelectric crystalline film of zinc oxide which overcomes the above disadvantages, there has been proposed a zinc oxide film containing copper. Such piezoelectric crystalline films can be used effectively at high frequences, but can not be used at low frequencies since their resistivity is not sufficiently high. Because, such films have a resistivity of about $10^8$ to $10^9$ $\Omega \cdot$cm, so that $f_c$ is $10^3$ to $10^4$ Hz when calculated by the above equation (1). Thus, the applicable frequencies of such films are not less than 100 KHz.

It has now found that these problems can be solved by incorporating vanadium and manganese together with or without copper into a zinc oxide film.

The incorporation of these additive elements can be achieved by the use of a ceramic of zinc oxide containing vanadium and manganese or a ceramic of zinc oxide containing vanadium, manganese and copper, as a film material source for sputtering.

It is therefore an object of the present invention to provide an improved piezoelectric crystalline film of zinc oxide which overcomes the aforesaid disadvantages and can be used as a transducer with good conversion efficiency in a wide range of low to high frequencies. Another object of the present invention is to provide a method for making such improved piezoelectric crystalline films.

According to the present invention, there is provided a piezoelectric crystalline film on a substrate, the film being a crystalline zinc oxide film with a hexagonal crystal structure, and a c-axis substantially perpendicular to the substrate surface, characterized in that said zinc oxide film contains vanadium and manganese together with or without copper.

In the piezoelectric crystalline films of zinc oxide according to the present invention, additive elements, i.e., vanadium, manganese and copper, may be present in any form such as, for example, oxides and compounds thereof. A category of the compounds includes, without being limited to sulphides, sulphates, phosphates, phosphides, and selenates of the respective additive elements.

Since the content of the additive elements has a great influence on the electrical and physical properties of the films, it is preferred to limit the content of the additive elements to the following ranges. The content of vanadium may range from 0.01 to 20.0 atomic percent when converted into the percentage of vanadium atoms. Because, if the content of vanadium is less than 0.01 atomic percent, the film changes for the worse in the quality, and if more than 20.0 atomic percent, the direction of the crystallographic orientation of the film can not be well controlled, resulting in the worse in the orientation of the piezoelectric crystalline film. The content of manganese may range from 0.01 to 20.0 atomic percent when converted into the percentage of manganese atoms. Because, a small amount of manganese less than 0.01 atomic percent results in the change for the worse in the film quality, and does not contribute to the improvement in the resistivity of the film, and a large amount of manganese more than 20.0 atomic percent results in the change for the worse in the orientation of the piezoelectric crystalline film. The content of copper may range from 0.01 to 20.0 atomic percent when converted into the percentage of copper atoms for the same reasons as mentioned above with respect to manganese.

As a material for the substrate on which a piezoelectric crystalline film is formed, there may be used those such as, for example, metal, glass, ceramics, single crystal, resin, rubber and the like.

The piezoelectric crystalline film of the present invention has a c-axis substantially perpendicular to the substrate surface, thus making it possible to produce piezoelectric transducers with a large electromechanical coupling factor, i.e., good conversion efficiency. Further, the piezoelectric cyrstalline films of the present invention have high resistivity, so that the films are applicable in a wide range of low to high frequencies.

Such films can be made by a method comprising sputtering source materials, i.e., zinc oxide, vanadium and manganese with or without copper onto a surface to form a crystalline zinc oxide film, the sputtering being effected by using a film material source consisting essentially of a ceramic of zinc oxide containing vanadium, and manganese together with or without copper.

The piezoelectric crystalline films of the present invention may be made by any sputtering methods such as, for example, radio-frequency sputtering, co-sputtering method.

These and other objects, features and advantages of the present invention will be further apparent from the following description with respect to examples and the accompanying drawing which shows a diagrammatic view of a known radio-frequency sputtering apparatus used for making piezoelectric crystalline films of the present invention.

Referring now to the FIGURE, there is shown a radio-frequency sputtering apparatus with two electrodes which is used for making piezoelectric crystalline films according to the present invention. The apparatus comprises a bell jar 1 in which a pair of electrodes, i.e., a planar cathode 2 and a planar anode 3, are positioned in parallel. Fixed on the cathode 2 is a film material source 4 consisting essentially of a ceramic of zinc oxide containing vanadium and manganese together with or without copper. A shutter 5 is positioned between electrodes 2 and 3. A substrate 6 consisting of a crystal or amorphours material, such as, for example, glass, metal, ceramics, single crystal, or resin is fixed to the bottom of the anode 3. The substrate 6 is heated to a temperature in a range from 20° C. to 600° C. during sputtering. A vent 7 and gas inlet 8 are provided in the bell jar 1.

The radio-frequency sputtering is effected in the following manner: After making it airtight, the bell jar 1 is evacuated through the vent 7 to a vacuum more than $1 \times 10^{-6}$ Torr, and then supplied with argon, or oxygen gas, or a mixture of argon and oxygen through the gas inlet 8, thereby adjusting the pressure in the bell jar to $1 \times 10^{-1}$ to $1 \times 10^{-4}$ Torr. A radio-frequency voltage is applied between the bell jar 1 and the cathode 2 by the radio-frequency electric power source 9. Electric power of 2 to 8 W/cm$^2$ is supplied to the film material source 4.

The film material sources consisting essentially of ceramics of zinc oxide containing vanadium and manganese, or ceramics of zinc oxide containing vanadium, manganese and copper are prepared in the following manner: Using powder of ZnO, V$_2$O$_5$, MnCO$_3$, and CuO as raw materials, there are prepared mixtures to produce ceramics of zinc oxide each having a compositional proportion shown in Table 1. Each of the mixture is milled by the wet process, dried and then calcined at 600° to 800° C. for 2 hours. The presintered body is crushed, milled by the wet process with an organic binder and then dried. The resultant powder is shaped into discs with a diameter of 100 mm and a thickness of 5 mm at a pressure of 1000 kg/cm$^2$ and then fired at 1200° C. for 2 hours to obtain film material sources.

The thus obtained film material sources were subjected to measurements of resistivity and percentage of bulk density $d_s$ to theoretical density $d_t$ ($d_s/d_t \times 100$). The results are shown in Table 1.

Using the respective film material sources, piezoelectric crystalline films of zinc oxide containing additive elements are made on glass substrates with the aforesaid radio-frequency sputtering apparatus. The radio-frequency sputtering is carried out under the following conditions: A mixed gas of 90 vol % of argon and 10 vol % of oxygen is supplied to the bell jar 1 through the gas inlet 8, thereby adjusting the pressure in the bell jar to $2 \times 10^{-3}$ Torr. A glass substrate is heated to and maintained at 350° C. The source 4 is supplied 6 W/cm$^2$ of an electric power with a frequency of 13.56 MHz.

The c-axis orientation of the thus obtained piezoelectric crystalline film was measured with a locking curve method by X-ray diffraction (Ref.: Minakata, Chubachi and Kikuchi "Quantitative Representation of c-axis Orientation of Zinc Oxide Piezoelectric Thin Films" The 20Th Lecture of Applied Physics Federation. Vol. 2 (1973) page 84; and Makoto Minakata, The Tohoku University Doctor's Thesis (1974)). The mean value ($\overline{X}$) and standard deviation ($\sigma$) of the angle of c-axis with respect to the axis perpendicular to the substrate surface were obtained from respective specimens. The results are shown in Table 1. Included in Table 1 are results of the measurements of resistivity, quality and adhesion of the crystalline films. The measurement of adhesion to the substrate was carried out by the thermal shock test methods 107C and MIL-STD-202D. A film which peeled off from the surface of the substrate was judged as "bad", a film in which cracks were produced was judged as "passable" and a film which showed no change was judged as "good".

sources containing the above additive elements make it possible to mass-produce zinc oxide piezoelectric crys- Table 1

| Specimen No. | Additive element (atomic %) | | | Film material source | | Piezoelectric crystalline film of zinc oxide | | | | |
|---|---|---|---|---|---|---|---|---|---|---|
| | V | Mn | Cu | Resistivity ($\Omega \cdot$ cm) | $d_s/d_t$ $\times 100$ (%) | Orientation $\overline{X}$ | $\sigma$ | Resistivity ($\Omega \cdot$ cm) | Quality | Adhesion |
| 1 | 0.1 | — | — | $1.7 \times 10^7$ | 99.5 | 1.6 | 2.6 | $5.2 \times 10^6$ | smooth | passable |
| 2 | — | 2.0 | — | $6.3 \times 10^8$ | 92.0 | 2.3 | 2.7 | $7.6 \times 10^{10}$ | — | bad |
| 3 | 0.005 | 0.005 | — | $7.6 \times 10^6$ | 89.0 | 3.1 | 3.8 | $8.7 \times 10^6$ | rough | " |
| 4 | 0.01 | 0.01 | — | $6.6 \times 10^{11}$ | 98.0 | 1.1 | 2.4 | $3.5 \times 10^8$ | smooth | good |
| 5 | 0.1 | 2.0 | — | $2.7 \times 10^{13}$ | 99.6 | 1.7 | 3.0 | $4.3 \times 10^{11}$ | " | " |
| 6 | 10.0 | 5.0 | — | $1.8 \times 10^{14}$ | 99.7 | 1.4 | 2.3 | $9.2 \times 10^{12}$ | " | " |
| 7 | 20.0 | 20.0 | — | $3.5 \times 10^{12}$ | 96.1 | 4.7 | 5.1 | $3.9 \times 10^9$ | " | " |
| 8 | 25.0 | 20.0 | — | $4.0 \times 10^9$ | 90.0 | — | — | — | — | — |
| 9 | 20.0 | 25.0 | — | $2.9 \times 10^{10}$ | 91.0 | — | — | — | — | — |
| 10 | 0.01 | 0.01 | 0.005 | $4.2 \times 10^{11}$ | 97.6 | 3.7 | 5.1 | $3.6 \times 10^8$ | smooth | good |
| 11 | 0.01 | 0.01 | 0.01 | $5.1 \times 10^{12}$ | 98.1 | 2.2 | 2.0 | $2.8 \times 10^{11}$ | " | " |
| 12 | 0.1 | 5.0 | 0.1 | $8.7 \times 10^{13}$ | 99.5 | 1.0 | 2.3 | $6.3 \times 10^{14}$ | smooth | good |
| 13 | 1.0 | 10.0 | 5.0 | $1.5 \times 10^{14}$ | 99.6 | 2.1 | 3.1 | $7.5 \times 10^{13}$ | " | " |
| 14 | 10.0 | 1.0 | 20.0 | $3.9 \times 10^{13}$ | 99.4 | 1.8 | 2.7 | $1.6 \times 10^{14}$ | " | " |
| 15 | 5.0 | 20.0 | 1.0 | $2.2 \times 10^{14}$ | 99.0 | 3.1 | 3.2 | $4.2 \times 10^{12}$ | " | " |
| 16 | 20.0 | 5.0 | 2.0 | $7.8 \times 10^{12}$ | 97.3 | 4.6 | 5.3 | $3.7 \times 10^{14}$ | " | " |
| 17 | 20.0 | 30.0 | 1.0 | $4.4 \times 10^{10}$ | 97.5 | — | — | — | — | — |
| 18 | 30.0 | 1.0 | 1.0 | $5.7 \times 10^{11}$ | 96.8 | — | — | — | — | — |
| 19 | 1.0 | 10.0 | 30.0 | $9.3 \times 10^{10}$ | 99.3 | — | — | — | — | — |

As can be seen from Table 1, the piezoelectric crystalline films according to the present invention have a c-axis substantially perpendicular to the substrate surface, from which it will be understood that the piezoelectric crystalline films of the present invention possess a large electromechanical coupling factor, i.e., good conversion efficiency. Further, the piezoelectric crystalline films of the present invention are smooth, and have good adhesion to the substrate and very high resistivity. As mentioned above, the dielectric relaxation angular frequency ($\omega_c$) is inversely proportional to the resistivity, so that the film with high resistivity can be used at low frequencies.

An applicable frequency range of the piezoelectric crystalline films of the present invention can be obtained by the determination of $\omega_c$ with the aforesaid equation (1). The values of $\omega_c$ for the specimens of the present invention are ranging from $10^{-2}$ to 10. Thus, the lowermost applicable frequency of the piezoelectric crystalline films of the present invention is 1 Hz and higher. This means that the piezoelectric crystalline films of the present invention can be used in a wide range of low to high frequencies. Thus, the piezoelectric crystalline films of the present invention can be applied to low frequency transducers such as, for example, a miniaturized tunning fork; and electronic devices such as, for example, a wave guide.

In the above examples, the additive elements are used in the oxide form as raw materials for preparing film material sources, but any other form such as metal, alloy, compound thereof may be used.

The use of a film material source containing vanadium and manganese together with or without copper has its own advantages, as follows.

When mass-producing piezoelectric crystalline films industrially by the radio-frequency sputtering method, it is necessary to increase the crystal growth rate as much as possible. To do this, the electric power supplied to the film material source per unit area thereof is increased with the results that the film material source is required to have a high bulk density. This requirement is fully satisfied by the sources containing vanadium and manganese, or sources containing vanadium, manganese and copper. As is evident from Table 1, these film material sources have a bulk density higher than that of the conventionally used sources. Thus, the film material sources containing the above additive elements make it possible to mass-produce zinc oxide piezoelectric crystalline films by the use of high electric power.

What we claim is:

1. A piezoelectric crystalline film on a substrate, the film being a crystalline zinc oxide film with a hexagonal crystal structure and a c-axis substantially perpendicular to the substrate surface, characterized in that said crystalline zinc oxide film contains, as additive elements, vanadium and manganese; the content of each of said additive elements being 0.01 to 20.0 atomic percent; said film being smooth and having good adhesion to said substrate.

2. The piezoelectric crystalline film of claim 1 wherein said substrate is made of a material selected from the group consisting of metal, glass, ceramics, single crystals, resin and rubber.

3. A piezoelectric crystalline film according to claim 1 wherein said crystalline zinc oxide film further contains 0.01 to 20.0 atomic percent of copper.

4. A method for making piezoelectric crystalline films comprising simultaneously sputtering film materials from a film material source onto a substrate to form a crystalline zinc oxide film with a hexagonal crystal structure and a c-axis substantially perpendicular to the substrate surface containing 0.01 to 20.0 atomic percent each of vandium and manganese, wherein said sputtering is effected by radio-frequency sputtering in an atmosphere of argon, or oxygen, or a mixture of argon and oxygen under a pressure of $1 \times 10^{-1}$ to $1 \times 10^{-4}$ Torr, and wherein said film material source consists essentially of ceramics of zinc oxide containing, as additive elements, vanadium and manganese, the content of each additive element being 0.01 to 20.0 atomic percent, said substrate being positioned on an anode placed in parallel with a cathode on which said film material source is positioned, said film material source being supplied with an electric power of 2 to 8 w/cm².

5. The method for making piezoelectric crystalline films according to claim 4 wherein said ceramics of zinc oxide further contains 0.01 to 20.0 atomic percent of copper.

6. The method for making piezoelectric crystalline films according to claim 4 wherein the substrate is maintained at a temperature in the range from 20° C. to 600° C. during sputtering.

* * * * *